United States Patent
Kahn et al.

(12) 
(10) Patent No.: US 6,662,278 B1
(45) Date of Patent: Dec. 9, 2003

(54) ADAPTIVE THROTTLING OF MEMORY ACCESES, SUCH AS THROTTLING RDRAM ACCESSES IN A REAL-TIME SYSTEM

(75) Inventors: Opher Kahn, Zichron Yacov (IL); Erez Birenzwig, Kiryat Ono (IL)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 09/667,649

(22) Filed: Sep. 22, 2000

(51) Int. Cl.[7] .......................... G06F 12/00; G06F 15/00; G06F 1/32; G11C 7/04
(52) U.S. Cl. ....................... 711/154; 702/132; 713/320; 365/211; 365/226
(58) Field of Search ............................ 711/154, 104, 711/105; 365/211, 226, 227, 228, 229; 713/300, 320–324; 702/136, 132, 130

(56) References Cited

U.S. PATENT DOCUMENTS

| | | | |
|---|---|---|---|
| 5,515,523 A | | 5/1996 | Kalkunte et al. |
| 5,719,800 A | * | 2/1998 | Mittal et al. ................ 713/321 |
| 5,953,685 A | * | 9/1999 | Bogin et al. ................ 702/136 |
| 6,021,076 A | * | 2/2000 | Woo et al. ................... 365/211 |
| 6,035,360 A | | 3/2000 | Doidge et al. |
| 6,058,450 A | | 5/2000 | LaBerge |
| 6,154,815 A | * | 11/2000 | Hetherington et al. ...... 711/140 |
| 6,233,190 B1 | * | 5/2001 | Cooper et al. .............. 365/212 |

FOREIGN PATENT DOCUMENTS

EP 0 831 402 A1 3/1998
WO US01/29694 4/2003

* cited by examiner

*Primary Examiner*—Kimberly N. McLean-Mayo
(74) *Attorney, Agent, or Firm*—Blakely, Sokoloff, Taylor & Zafman LLP

(57) ABSTRACT

Apparatus and methods to adaptively throttle accesses to memory employ a masking tool to specify the percentage of memory bandwidth available for access. The apparatus applies the mask and monitors the number of memory accesses during a throttle-monitoring window. If the number of memory accesses during the throttle-monitoring window exceeds or is fewer than the percentage of memory bandwidth specified by the mask, access to the memory continues until the end of the throttle-monitoring window. At the end of the throttle-monitoring window, the apparatus selects the next lower mask, which has a lower memory bandwidth allocation, applies the next lower mask, and monitors the number of memory accesses during the next throttle-monitoring window. If the number of memory accesses during the throttle-monitoring window is fewer than the percentage of memory bandwidth specified by the mask, at the end of the throttle-monitoring window, the apparatus selects the next higher mask, which has a higher memory bandwidth allocation, applies the next higher mask, and monitors the number of memory accesses during the next throttle-monitoring window. The mask itself comprises a series of ones and zeros indicating clock cycles where access to memory is allowed or disallowed. The pattern of the mask is designed to minimize the number of clock cycles in which memory is blocked. The apparatus and methods reduce the amount of time that memory is blocked in throttle mode, thus allowing real-time streams to proceed without interruption.

6 Claims, 3 Drawing Sheets

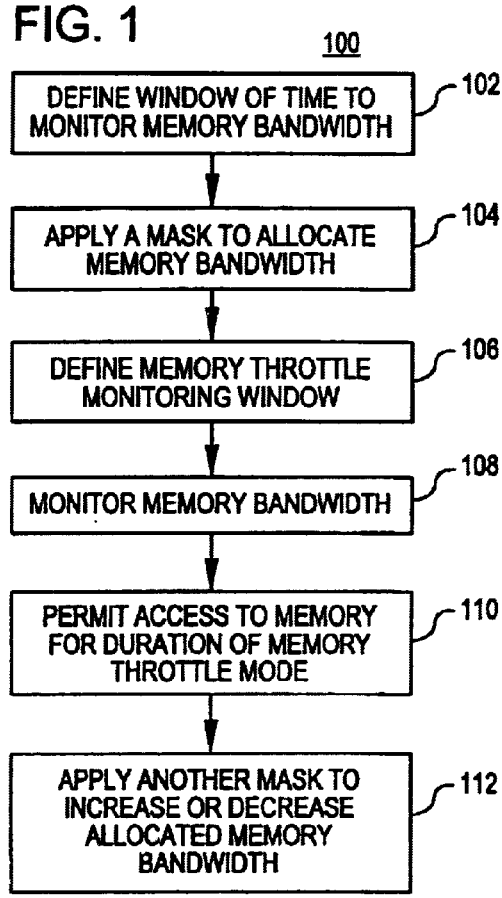
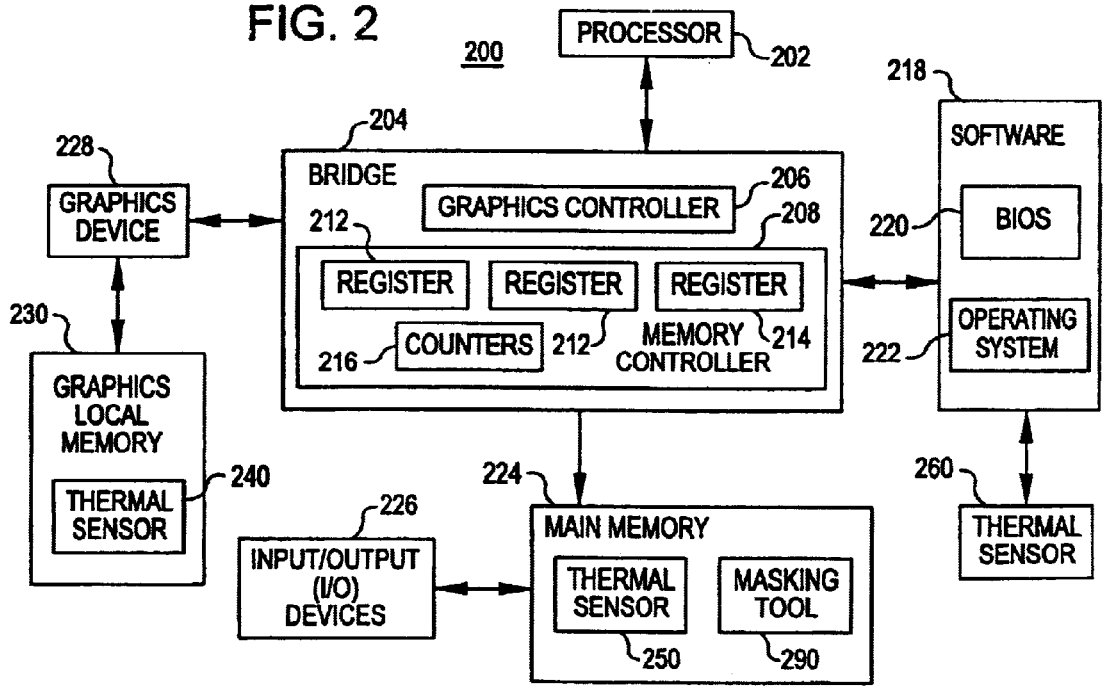

| MASK # | MASK | PERCENTAGE OF BANDWIDTH (RESOLUTION) |
|---|---|---|
| 301 | 0 1 1 1 1 1 1 1 1 1 1 1 1 1 | 7% |
| 302 | 0 1 1 1 1 1 1 0 1 1 1 1 1 1 | 14% |
| 303 | 0 1 1 1 1 0 1 1 1 1 0 1 1 1 | 21% |
| 304 | 0 1 1 0 1 1 1 0 1 1 1 0 1 1 | 28% |
| 305 | 0 1 1 0 1 1 0 1 0 1 1 0 1 1 | 35% |
| 306 | 0 1 0 1 1 0 1 0 1 0 1 0 1 1 | 42% |
| 307 | 1 0 1 0 1 0 1 0 1 0 1 0 1 0 | 50% |
| 308 | 1 0 1 0 0 1 0 1 0 1 0 1 0 0 | 58% |
| 309 | 1 0 0 1 0 0 1 0 1 0 0 1 0 0 | 65% |
| 310 | 1 0 0 1 0 0 0 1 0 0 1 0 0 0 | 72% |
| 311 | 1 0 0 0 0 1 0 0 0 0 1 0 0 0 | 79% |
| 312 | 1 0 0 0 0 0 0 1 0 0 0 0 0 0 | 86% |
| 313 | 1 0 0 0 0 0 0 0 0 0 0 0 0 0 | 93% |
| 314 | 0 0 0 0 0 0 0 0 0 0 0 0 0 0 | 100% |

ADAPTIVE THROTTLING OF MEMORY ACCESES, SUCH AS THROTTLING RDRAM ACCESSES IN A REAL-TIME SYSTEM

BACKGROUND OF THE INVENTION

1. Field of the Invention

The invention is related to computers and computer technology, and in particular, to computer memory.

2. Background Information

In today's computers under certain conditions it is often desirable to speed up and slow down the computer's operations. This slowing down and speeding up is sometimes called "throttling." Throttling can be for a variety of reasons. For example, throttling can be used to conserve battery power in mobile computers.

Throttling also can be used in association with the computer's memory devices or memory controller. Slowing down and speeding up the rate of requests in association with memory is often referred to as "memory throttling," which reduces memory accesses. This may also be referred to as "thermal throttling" because memory devices and controllers can overheat if there are too many memory accesses over a period of time. Overheating is particularly troublesome in mobile or other low-power computers.

Memory throttling can have a negative impact in, for example, systems that have real-time requirements. Systems that use display streams, such as video conferencing and movie previewing, for example, have strict real-time requirements and must be guaranteed fast access to memory. If the memory controller fails to respond quickly enough to memory requests from the computer display, the local buffer associated with the computer display underflows, which causes flickers on the computer display. To minimize chances of buffer underflow, the computer display typically makes many accesses to memory, each access being for a small amount of pixels.

There are many existing schemes to throttle memory. One such scheme counts the number of memory accesses occurring during a period of time. If the number of memory accesses exceeds a threshold number of memory accesses, then all subsequent accesses to memory are blocked for another, longer period of time. That is, memory is unavailable for a long period of time, which is troublesome in computers that process streaming data in real time.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 1 depicts an example method to throttle memory according to an embodiment of the present invention;

FIG. 2 shows a computer system suitable for implementing an embodiment of the present invention;

DETAILED DESCRIPTION OF THE ILLUSTRATED EMBODIMENTS

Figures 3, 4:
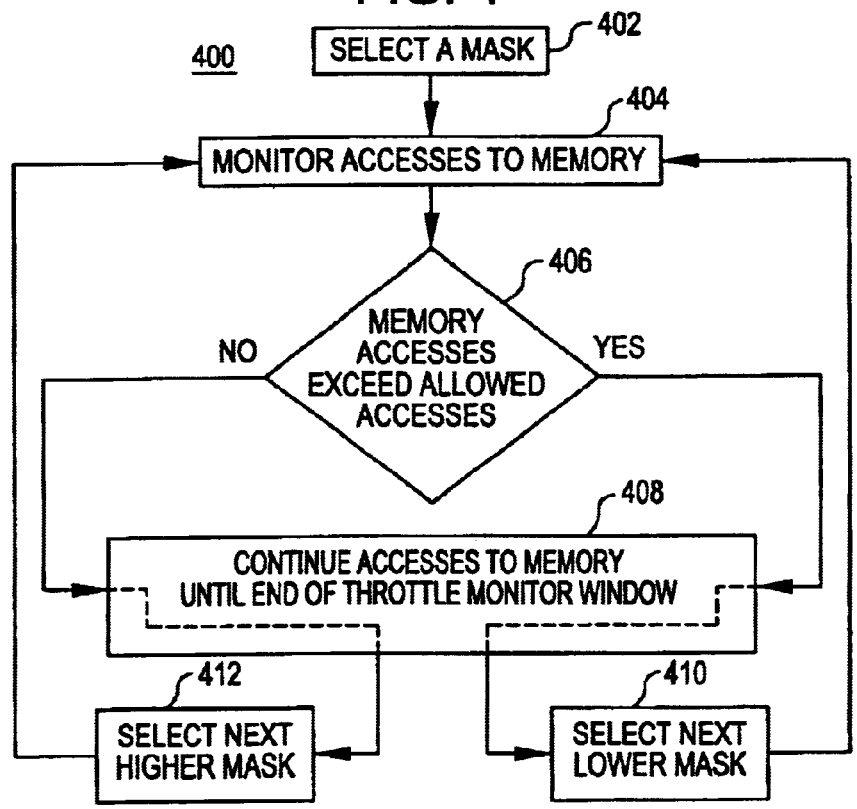
FIG. 3 is a graphical representation of a memory throttling mechanism suitable for use with an embodiment of the present invention.
FIG. 4 illustrates a mask according to an embodiment of the present invention.

Adaptive memory throttling, is described in detail herein. In the following description, various aspects of the invention are described. However, it will be apparent to those skilled in the art that the invention may be practiced with only some or all aspects of the invention. For purposes of explanation, specific numbers, methods, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Some parts of the description will be presented using terms such as program, mask, register, counter,: memory, controller, and so forth, commonly employed by those skilled in the art to convey the substance of their work to others skilled in the art. Other parts of the description will be presented in terms of operations performed by a computer system, using terms such as accessing, determining, counting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete steps performed in turn in a manner that is most helpful in understanding the invention. However, the order in which they are described should not be construed to imply that these operations are necessarily order dependent or that the operations be performed in the order in which the steps are presented.

The invention is described below in further detail with respect to several examples for illustration. Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

An aspect of the present invention controls access to memory using a masking tool to block memory traffic (or throttle) for a period of time. The masking tool significantly reduces the amount of time that memory is idle or unavailable when compared to conventional memory throttling schemes. This feature is particularly advantageous for computer systems that have real time requirements and which cannot tolerate long periods of memory unavailability. Moreover, controlling accesses to memory permits the temperature of memory to be reduced by allowing only a percentage of memory bandwidth, or number of reads and writes (accesses) per unit of time.

Another aspect of the present invention uses an adaptive masking tool to increase or decrease memory bandwidth allocation. This feature blocks more or less memory traffic in the next time period based on the previous time period's memory accesses. The adaptive masking tool allows for bursts of memory accesses typical of many real time systems and "smoothes out" memory accesses between the different time periods.

Another aspect of the present invention uses an adaptive masking tool as a history mechanism that stores information about memory accesses from previous time periods. For example, the adaptive masking tool remembers weak or strong periods of memory accesses and changes masks to allow more or fewer memory accesses per time period.

Following are several terms and their definitions as used herein. These terms represent parameters that may be stored in one or more registers. The term "sampling window" refers to a length of time over which a number of words are counted. The term "throttle time" refers to how long thermal throttling remains in effect as a number of sampling windows. The term "throttle-monitoring window" refers to a window of memory clocks during which the number of words written to or read from memory is monitored while the thermal throttling mechanism is invoked. The term "number of allowed accesses" refers to the number of words permitted to be read from or written to memory within in one throttle-monitoring window.

FIG. 1 depicts a method 100 to throttle memory according to an aspect of the present invention. Step 102 defines the window of time in which to monitor memory bandwidth. In one embodiment, step 102 defines the sampling window. In another embodiment, memory bandwidth is monitored by monitoring words written to or read from memory.

Step 104 applies a mask to allocate memory bandwidth. In one embodiment, the mask sets the specific clock cycles in which memory accesses can proceed to memory. In other words, the mask defines the number and pattern of memory accesses.

Step 106 defines the memory throttle-monitoring window.

Step 108 monitors memory bandwidth. In one embodiment, step 108 monitors the number of words read from or written to memory within the sampling window.

Step 110 permits access to memory for the duration of the throttle-monitoring window. In one embodiment, step 110 permits words to be written to or read from memory during the throttle-monitoring window. This is true regardless of the number of words read from or written to memory during the sampling window.

Step 112 applies another mask to increase or decrease allocated memory bandwidth based on the number of words read from or written to memory within in one throttle-monitoring window while thermal monitoring was in effect. The mask redefines the number of accesses during the current throttle-monitoring window. For example, the next lower mask is applied, and the number of allowed accesses is decreased, if the number of words read from or written to memory within in the throttle-monitoring window exceeded the number of allowed accesses. Alternatively, the next higher mask is applied, and the number of allowed accesses is increased, if the number of words read from or written to memory within the throttle-monitoring window did not exceed the number of allowed accesses.

FIG. 2 is a block diagram of, a computer system 200 suitable for implementing the method 100. The computer system 200 includes a processor 202, which performs its conventional functions of executing programming instructions, including implementing the teachings of the present invention. The processor 202 can be a processor of the Pentium® family available from Intel Corporation of Santa Clara, Calif.

The computer system 200 includes a bridge 204, which, in general, provides communication protocol conversion and provides interrupt handling, and serves as a memory agent. Bridge technology is well known and for the sake of brevity will not be described in any further detail.

The bridge 204 includes a graphics controller 206, which receives commands and data from the processor 202 and generates display signals (e.g., in RGB format). Graphics controller technology also is well known.

The bridge 204, includes a memory controller 208, which manages memory. The memory controller 208 performs its conventional functions of controlling and monitoring the status of memory data lines, error checking, etc. Memory controller technology is well known.

The memory controller 208 includes three registers 210, 212, and 214, which are storage devices that have a specified storage capacity, such as a bit, a byte, or a computer word. In an embodiment, the register 210 specifies the throttle-monitoring window. In another embodiment, the register 212 specifies the number of allowed accesses to set memory bandwidth. In still another embodiment, the register 212 also is used to set memory bandwidth allocations. Register technology is well known.

The register 214 specifies the throttle time. The throttle time specifies how long thermal throttling remains in effect. Throttle time is divided into several throttle-monitoring windows.

The memory controller 208 also includes a set of counters 216, which typically include one or more individual counters. The counters 216, in an embodiment, measure the memory bandwidth over a pre-determined time period. In this embodiment, the counters 216 count the number of memory accesses during the throttle-monitoring window. Counter technology is well known.

The computer system 200 also includes software 218, which is, in general, control logic, instructions, commands, code, computer programs, etc. The software 218 is executed by the computer system 200 to perform functions described herein. Execution of software in computer systems is well known.

The software 218 includes a basic input/output system (BIOS) 220, which is a low-level interface set of instructions between application software and hardware. The BIOS 220 typically includes a set of functions that are performed when the software 218 invokes a specific routine. In one embodiment, the registers 210 and 214 are pre-programmed by the BIOS 220. The BIOS 220 may be stored in a read only memory (ROM) device. BIOS technology is well known.

The software 218 also includes an operating system 222, which performs its conventional functions of managing the allocation and de-allocation of resources within the computer system 200 during execution of programs. The operating system 222 may be stored in a ROM device. Operating systems are well known and the Windows® operating system is suitable.

The computer system 200 includes a main memory 224, which performs its conventional functions of storing data (pixels, frames, audio, video, etc.) and software (control logic, instructions, code, computer programs, etc.) for access by other system components. In general, the memory 224 includes several data lines corresponding to several addressable storage locations. In one embodiment, each data line handles eight data words (or sixty-four bytes). In another embodiment, each data line handles sixteen data words (or 128 bytes). Memory technology is well known, and suitable memory can be a random access memory (RAM) available from Rambus Inc., in Mountain View Calif., such as Rambus® Dynamic RAM (RDRAM).

The computer system 200 includes input/output (I/O) devices 226, which typically are peripheral components, or devices, such as printers, local disk drives, compact disk (CD) ROMs, local area networks (LANs), sound modules, small computer system interfaces (SCSI), etc. The I/O devices 226 generally have I/O drivers, which read and write to memory for the I/O devices 226. I/O devices are well known.

The computer system also includes a graphics device 228, which is, in general, a screen that displays images. Typical images include three-dimensional images, animation effects, video, text, etc. Graphics device technology is also well known, and thus, will not be described in any further detail.

In the embodiment depicted in FIG. 2, traffic to and from the main memory 224 comes from the processor 202, the graphics device 228, or the I/O devices 226. Of course, the source of requests to access memory (or traffic) is not important to the present invention.

The graphics device 228 is coupled to a graphics local memory 230, which in one embodiment, is a small frame buffer with sixteen megabytes of memory. In another embodiment, the graphics local memory 230 is a small frame buffer with eight megabytes of memory.

The computer system 200 includes three thermal sensors. One thermal sensor 240 is provided to measure temperature in the graphics local memory. A second thermal sensor 250 measures temperature in the main memory 224. A third thermal sensor 260 measures temperature within the computer system 200 overall.

There are various ways to cause the computer system 200 to begin memory throttling. For example, the thermal sensor 250 can trigger memory throttling by indicating to the memory controller 208 that the temperature in the main memory 224 is too high. The thermal sensor 260 can trigger memory throttling by indicating to the BIOS 220 or the operating system 222 that the temperature inside the, computer system 200 is too high. In an embodiment where the masking device is in the graphics local memory 230, the thermal sensor 240 can trigger memory throttling by indicating to the graphics controller 206 that the temperature in the graphics local memory 230 is too high.

The software 218, including the BIOS 220 and the operating system 222, can decide on its own to cause the computer system 200 to enter into memory throttle mode. For example, the software 218 can receive indications from the thermal sensor 260 that the temperature in the computer system 200 is too high. There can be a separate control register in the memory controller 208, which is set when the temperature as measured by the thermal sensor 260 exceeds a pre-determined limit.

Of course, thermal sensors can be used to trigger memory throttling in a variety of devices. For example, the I/O drivers for the I/O devices 226 may need to be cooled as well.

The counters 216 can also trigger memory throttle mode. For example if the number of main memory 224 accesses exceeds the limits set by the BIOS 220, the computer system 200 can enter memory throttle mode. Accordingly, the particular mechanism used to enter memory throttling does not limit the present invention.

Once a decision has been made to place the computer system 200 into memory throttle, the computer system 200 begins to throttle memory. Conventionally, the computer system 200 would count the number of words written to and read from memory during the sampling window. If the number of words exceeds the number of allowed accesses, then all accesses to memory (main memory 224, graphics local memory 230, etc.) from that point in time until the end of the throttle-monitoring window are blocked. This means that read and write requests from the processor 202, the I/O devices 226, and the graphics controller 206, are blocked.

In one embodiment, the main memory 224 includes a masking tool 290 to allow read and write requests to reach memory from the processor 202, the I/O devices 226, the graphics controller 206, etc., regardless of whether the number of words exceeds the number of allowed accesses.

Initially, the masking tool 290 selects a mask from among several masks. The masking tool 290 selects masks using a well-known masking algorithm. In one embodiment, the masking tool 290 calculates a mask for each throttle-monitoring window. In the embodiment shown in FIG. 2, the masking tool 290 is located in the main memory 224. Alternatively, the masking tool 290 can be located in the memory controller 208. In these two embodiments, the masking tool 290 controls the bandwidth of the main memory.

In another embodiment, the masking tool 290 is located in the graphics local memory 250 (or the graphics controller 206) and controls the bandwidth of the graphics local memory 250. Of course, the masking tool 290 can control access to various memory devices. Moreover, the masking tool 290 may be located in a memory controller.

FIG. 3 is a set of masks 300 selected by the masking tool 290. In one embodiment, the set of masks 300 is located in the memory controller 208.

The masks 300 include fourteen individual. masks (301 through 314) with different numbers of ones and zeros. For each individual mask, each "0" corresponds to a clock cycle in which memory access is allowed. Each "1" corresponds to a clock cycle in which memory access is blocked. Of course, the convention can be switched such that each "0" corresponds to a clock cycle in which memory access is allowed and each "1" corresponds to a clock cycle in which memory access is blocked. Using the description herein, persons of ordinary skill in the relevant art could readily implement the switched embodiment.

In the embodiment shown in FIG. 3, the set of masks is a fourteen-bit mask, which provides seven percent resolution and allocates seven percent of memory 224 bandwidth to the memory controller 208. Of course, the masks can be longer or shorter. The longer the mask is, the greater the resolution (in memory bandwidth). For one percent resolution, the masks are one hundred bits long. For twenty percent resolution the masks are five bits long. From the description provided herein, persons of ordinary skill in the relevant art would be able to implement masks for a variety of resolutions.

The pattern of the mask is designed to minimize the number of cycles in which memory is blocked. This is accomplished by interleaving the ones and zeros as much as possible.

Figure 5:
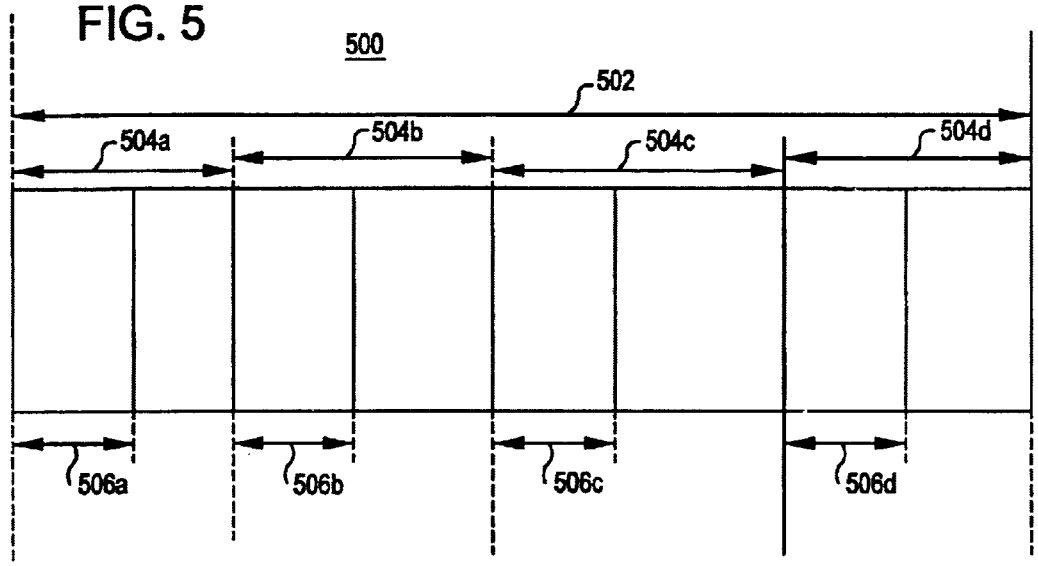
FIG. 5 is a flowchart illustrating an exemplar method to throttle memory.

FIG. 4 shows a method 400 to throttle memory using the masking tool 290. FIG. 4 is described in conjunction with FIG. 5, which is a graphical representation of a throttle mechanism 500. The throttle mechanism 500 includes a throttle time 502. The throttle time 502 is divided into throttle-monitoring windows (504), as indicated by throttle-monitoring windows 504a, 504b, 504c, and 504d. The predetermined number of allowed accesses (506) includes the number of allowed accesses 506a, 506b, 506c, and 506d, which correspond to the throttle-monitoring windows 504a, 504b, 504c, and 504d.

In step 402, the masking tool 290 selects a mask. In an embodiment, the masking tool 290 begins with the fifty percent mask 307. Selecting the fifty percent mask 307 sets the number of allowed accesses 506a during the throttle-monitoring window 504a to fifty percent of the memory bandwidth.

In step 404, the masking tool 290 monitors the accesses to memory during the throttle-monitoring window 504a. In step, 406, the masking tool 290 determines whether the number of memory accesses exceeded the number of allowed accesses 506a or exceeded the percentage of memory bandwidth set by the mask 307.

In step 408, if the masking tool 290 determines that the number of memory accesses exceeds the number of allowed accesses 506a, or that the percentage of memory bandwidth was exceeded, the masking tool 290 permits the memory to be accessed until the end of the throttle-monitoring window 504a.

At the end of the throttle-monitoring window 504a, if the masking tool 290 determined that the number of memory accesses exceeded the number of allowed accesses 506a, in step 410 the masking tool 290 selects the next lower mask. In an embodiment, the masking tool 290 selects the forty-two percent mask 306. Selecting the forty-two percent mask 306 sets the number of allowed accesses 506b during the throttle-monitoring window 504b to forty-two percent of the memory bandwidth.

The method 400 returns to step 404, where the masking tool 290 monitors the accesses to memory during the throttle-monitoring window 504b. In step 406, the masking tool 290 determines whether the number of memory accesses exceeded the number of allowed accesses 506b, which is now forty-two percent of memory bandwidth. If, in step 408, if the masking tool 290 determines that the number of memory accesses exceeds the forty-two percent of memory bandwidth, the masking tool 290 permits the memory to be accessed until the end of the throttle-monitoring window 504b. At the end of the throttle-monitoring window 504b, if the masking tool 290 determined that the number of memory accesses exceeded forty-two percent of memory bandwidth, in step 410 the masking tool 290 selects the thirty-five percent mask 305.

As long as the number of memory accesses exceeds the allocated bandwidth, the masking tool 290 will continue to select the next lower mask. Eventually, the masking tool 290 will reach the lowest mask and only minimal bandwidth is allocated.

Alternatively, at the end of the throttle-monitoring window 504a, if the masking tool 290 determined that the number of memory accesses did not exceed the number of allowed accesses 506a, in step 412 the masking tool 290 selects the next higher mask. In an embodiment, the masking tool 290 selects the fifty-eight percent mask 308. Selecting the fifty-eight percent mask 306 sets the number of allowed accesses 506b during. the throttle-monitoring window 504b to fifty-eight percent of the memory bandwidth.

In this embodiment, the masking tool 290 monitors the accesses to memory during the throttle-monitoring window 504b. In step, 406, the masking tool 290 determines whether the number of memory accesses exceeded the number of allowed accesses 506b, which is now fifty-eight percent of memory bandwidth. If, in step 408, if the masking tool 290 determines that the number of memory accesses exceeds the fifty-eight percent of memory bandwidth, the masking tool 290 permits the memory to be accessed until the end of the throttle-monitoring window 504b. At the end of the throttle-monitoring window 504b, if the masking tool 290 determined that the number of memory accesses exceeded fifty-eight percent of memory bandwidth, in step 410 the masking tool 290 selects the sixty-five percent mask 309.

As long as the number of memory accesses is fewer the allowed memory bandwidth, the masking tool 290 will continue to select the next higher mask. Eventually, the masking tool 290 will reach the highest mask and all memory bandwidth is allocated. That is, all attempts to access memory will be allowed.

At the end of each throttle-monitoring window 504, the method 400 makes a decision to apply a higher or lower mask. In this manner, the masking tool 290 keeps operating during the entire throttle time 502. The masking tool 290 continues to move among the masks 300 based on memory traffic from the previous throttle-monitoring window 504. If there was less traffic for several throttle-monitoring windows 504, the masking tool 290 continues to raise the percentage of memory bandwidth available for access. The method 400 thus allows adaptive smoothing out of memory accesses between the different throttle-monitoring windows 504. There is an average memory bandwidth over a long period (many throttle-monitoring windows 504).

For example, if the masks continue to shift between the next lower mask, e.g., forty-two percent of memory bandwidth, and the next higher mask, e.g., fifty percent of memory bandwidth, the average memory bandwidth is approximately forty-six percent of memory bandwidth. When the desired memory bandwidth is less than the number of allowed accesses 506 per throttle-monitoring window 504, the average memory bandwidth is closer to the desired memory bandwidth than with conventional methods. This is in effect a history mechanism that remembers weak or strong periods of memory accesses and adapts the mask to allow more or fewer memory accesses per time period by taking into account periods where the number of memory accesses is significantly lower or higher than the allowed number of memory accesses.

Aspects of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.) that include computer readable program code embodied in a computer usable medium to cause a computer to perform functions herein.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A system, comprising:
 a memory having a memory bandwidth;
 a memory controller coupled to the memory; and
 a masking tool applied to the memory to increase a percentage of memory bandwidth or a number of memory accesses allocated to the memory controller higher than an original bandwidth or number of memory accesses allocated when memory accesses by the memory controller are less than the memory bandwidth or the number of memory accesses allocated to the memory controller and to decrease the percentage of memory bandwidth or a number of memory accesses allocated to the memory controller lower than an original bandwidth or number of memory accesses allocated when memory accesses by the memory controller are less than the memory bandwidth or the number of memory accesses allocated to the memory controller.

2. The system of claim 1, further comprising:

a first register in the memory controller to set percentage of memory bandwidth or the number of memory accesses allocated to the memory controller;

a second register in the memory controller to set a window of time to monitor percentage of memory bandwidth or number of memory accesses used by the memory controller; and a counter in the memory controller to measure percentage of memory bandwidth used or number of memory accesses by the memory controller during the window of time.

3. The system of claim 1, further comprising:

a first register in the memory controller to set percentage of memory bandwidth or number of memory accesses;

a second register in the memory controller to set a window of time to monitor percentage of memory bandwidth used or number of memory accesses by the memory controller;

a counter in the memory controller to measure percentage of memory bandwidth used or number of memory accesses by the memory controller during the window of time; and a mask applied to the memory controller to increase the percentage of memory bandwidth or the number of memory accesses allocated to the memory controller when memory accesses by the memory controller are less than the percentage of memory bandwidth or the number of memory accesses allocated to the memory controller.

4. The system of claim 1, further comprising:

a first register in the memory controller to set the percentage of memory bandwidth;

a second register in the memory controller to set a window of time to monitor a percentage of memory bandwidth used the memory controller;

a counter in the memory controller to measure the percentage of memory bandwidth used or the number of memory accesses by the memory controller during the window of time; and a mask applied to the memory controller to decrease the percentage of memory bandwidth or the number of memory accesses allocated to the memory controller when memory accesses by the memory controller are less than the percentage of memory bandwidth or the number of memory accesses allocated to the memory controller.

5. The system of claim 1, further comprising a mask applied to the memory controller to increase the percentage of memory bandwidth or the number of memory accesses allocated to the memory controller when memory accesses by the memory controller are less than the memory bandwidth or the number of memory accesses allocated to the memory controller.

6. The system of claim 1, further comprising a mask applied to the memory controller to decrease memory bandwidth or the number of memory accesses allocated to the memory controller when memory accesses by the memory controller are more than the memory bandwidth or the number of memory accesses allocated to the memory controller.

* * * * *